(12) United States Patent
Khosrowpour et al.

(10) Patent No.: US 6,477,593 B1
(45) Date of Patent: Nov. 5, 2002

(54) STACKED I/O BRIDGE CIRCUIT ASSEMBLIES HAVING FLEXIBLY CONFIGURABLE CONNECTIONS

(75) Inventors: Farzad Khosrowpour, Lyons, CO (US); Victor Key Pecone, Lyons, CO (US)

(73) Assignee: Adaptec, Inc., Milpitas, CA (US)

( * ) Notice: Subject to any disclaimer, the term of this patent is extended or adjusted under 35 U.S.C. 154(b) by 0 days.

(21) Appl. No.: 09/096,033

(22) Filed: Jun. 11, 1998

(51) Int. Cl.$^7$ ............................ G06F 13/00; H01R 12/16
(52) U.S. Cl. ........................................ 710/100; 361/790
(58) Field of Search ........................ 710/100; 361/790; 439/74, 69

(56) References Cited

U.S. PATENT DOCUMENTS

| | | | | |
|---|---|---|---|---|
| 5,201,038 A | * | 4/1993 | Fielder ........................ | 710/100 |
| 5,462,442 A | * | 10/1995 | Umemura et al. ............ | 439/69 |
| 5,583,749 A | * | 12/1996 | Tredennick et al. ........ | 361/790 |
| 5,707,242 A | * | 1/1998 | Mitra et al. .................... | 439/74 |
| 5,802,333 A | * | 9/1998 | Melvin ......................... | 395/311 |
| 5,860,142 A | * | 1/1999 | Cepulis ....................... | 711/202 |

\* cited by examiner

*Primary Examiner*—John A. Follansbee
(74) *Attorney, Agent, or Firm*—Patton Boggs LLP

(57) ABSTRACT

An I/O bridge system comprises a motherboard including first and second busses, e.g., first and second PCI busses. A I/O bridge circuit is connected between the first and second busses and operative to communicate therebetween. A first connector is disposed on a side of the motherboard and has the first bus provided thereat. A second connector is disposed on the side of the motherboard, positioned laterally adjacent the first connector and has the second bus provided thereat. An interconnected stack of daughterboards is disposed on the motherboard and connected to the first and second connectors of the motherboard. A daughterboard of the interconnected stack includes an I/O bridge circuit connected to one of the first bus or the second bus depending on the position of the daughterboard in the interconnected stack. The I/O bridge circuit is operative to communicate between one of the motherboard busses and a communications channel such as a Fibre Channel.

22 Claims, 3 Drawing Sheets

STACKED I/O BRIDGE CIRCUIT ASSEMBLIES HAVING FLEXIBLY CONFIGURABLE CONNECTIONS

BACKGROUND OF THE INVENTION

Field of the Invention

The present invention relates to data communications systems and methods, and more particularly, to input/output (I/O) bridge systems and methods.

STATEMENT OF THE PROBLEM

High-bandwidth busses are typically used to communicate between hosts and peripherals in applications such as computer networks. The bus interfaces used by hosts and peripherals often take different forms depending on the performance characteristics desired. For example, host devices may communicate via a Fibre Channel (FC) interface, while a peripheral such as a disk array may utilize a differential or single-ended Small Computer System Interface (SCSI) or other bus interface. When hosts and peripherals use disparate bus architectures, IO bridges are often utilized to provide connectivity.

I/O (or bus) bridges may also be used to increase the capacity of bus systems. Bus specifications often limit, among other things, the length of the bus and the number of devices that may be attached to the bus in order to maintain performance. For example, the Peripheral Component Interconnect (PCI) bus specification commonly employed in personal computer bus applications has detailed rules for round trip propagation delay and capacitive loading which help maintain the integrity of communications at specified bus clock rates. In order to increase the capacity of such a bus, an expanded multi-layer bus structure may be used that includes a plurality of busses connected by high-speed I/O bridges. This multi-layer structure can allow an increased number of devices to be interconnected while maintaining bus performance.

Although computer systems and networks may be expanded by the addition of I/O bridges, it may be problematic to provide for such expansion. Networks typically evolve over time, the number and types of devices connected in the network changing as users, services and functions are added to or removed from the network. This network evolution may affect the I/O bridges used in the network. Replacement or reconfiguration of devices in a network may require replacement of fixed I/O bridges connected to these devices. The replacement of I/O bridges may represent a significant cost, especially in a network having a frequently changing configuration.

SUMMARY OF THE INVENTION

In light of the foregoing, it is an object of the present invention to provide I/O bridge systems that may be reconfigured without requiring replacement of an entire bridge assembly.

This and other objects, features and advantages are provided according to the present invention by stacked circuit assemblies including a motherboard having first and second busses connected by a I/O bridge circuit, and a plurality of interface daughterboards stacked on the motherboard, a respective daughterboard being connected to one of the first and second busses depending on the position of the daughterboard in the stack. Crossed bus connections are provided through each of the daughterboards such that a bus interface circuit, e.g., an VO bridge circuit, of a daughterboard is connected to one motherboard bus while the other motherboard bus is conveyed through for connection to an a bus interface circuit on an adjacent daughterboard.

A stacked motherboard/daughterboard structure provided according to the present provides a modular I/O bridge architecture that can be easily reconfigured. To change the I/O bridge configuration, a daughterboard supporting a first configuration can simply be replaced by a daughterboard supporting a second configuration. The order of the daughterboards can be changed to change the arrangement of interfaces on the motherboard busses. In this manner, network reconfiguration can be achieved without requiring replacement of an entire assembly.

In particular, according to the present invention, a stacked circuit board assembly comprises a motherboard including a first bus and a second bus. A first connector is disposed on a side of the motherboard and has the first bus provided thereat. A second connector is disposed on the side of the motherboard, positioned laterally adjacent the first connector, and has the second bus provided thereat. An interconnected stack of daughterboards is disposed on the motherboard and connected to the first connector and the second connector of the motherboard. A daughterboard of the interconnected stack includes a bus interface circuit connected to one of the first bus or the second bus depending on the position of the daughterboard in the interconnected stack.

In an embodiment of the present invention, a respective one of a first daughterboard and a second daughterboard has a first side and an opposing second side and includes a first connector disposed on the first side. A second connector is disposed on the first side and positioned laterally adjacent the first connector. A third connector is coupled to the second connector, disposed on the second side and positioned opposite the first connector. A fourth connector is coupled to the first connector, disposed on the second side and positioned opposite the second connector and laterally adjacent the third connector. A bus interface circuit is coupled to the first and fourth connectors. The first connector and the second connector of the first daughterboard are mated with the third connector and the fourth connector, respectively, of the second daugterboard. The third connector and the fourth connector of the first daughterboard may be mated with the first connector and the second connector, respectively, of the motherboard.

In another embodiment of the present invention, an I/O bridge system comprises a motherboard including first and second busses, e.g., first and second PCI busses. An I/O bridge circuit is connected between the first and second busses and operative to communicate therebetween. A first connector is disposed on a side of the motherboard and has the first bus provided thereat. A second connector is disposed on the side of the motherboard, positioned laterally adjacent the first connector and has the second bus provided thereat. An interconnected stack of daughterboards is disposed on the motherboard and connected to the first and second connectors of the motherboard. A daughterboard of the interconnected stack includes an I/O bridge circuit connected to one of the first bus or the second bus depending on the position of the daughterboard in the interconnected stack. The I/O bridge circuit is operative to communicate between one of the motherboard busses and a communications channel such as a Fibre Channel.

In yet another embodiment according to the present invention, a stackable bus interface daughterboard comprises a substrate having a first side and an opposing second side. A first connector is disposed on the first side of the substrate. A second connector is disposed on the first side of the substrate and positioned laterally adjacent the first connector. A third connector is disposed on the second side of the substrate, positioned opposite the first connector and coupled to the second connector. A fourth connector is disposed on the second side of the substrate, positioned opposite the second connector and laterally adjacent the third connector and coupled to the first connector. A bus interface circuit is attached to the substrate, coupled to the first and fourth connectors and operative to communicate on a bus connected to the daughterboard via the first connector or the fourth connector. The first and second connectors may be configured to mate with third and fourth connectors, respectively, of a similar daughterboard positioned on the first side of the circuit substrate. The third and fourth connectors may be configured to mate with first and second connectors, respectively, of a similar daughterboard positioned on the second side of the circuit substrate. The bus interface circuit may comprise an I/O bridge circuit. Flexibly configurable 110 bridge assemblies may thereby be provided.

DETAILED DESCRIPTION OF EMBODIMENTS

Figure 1:
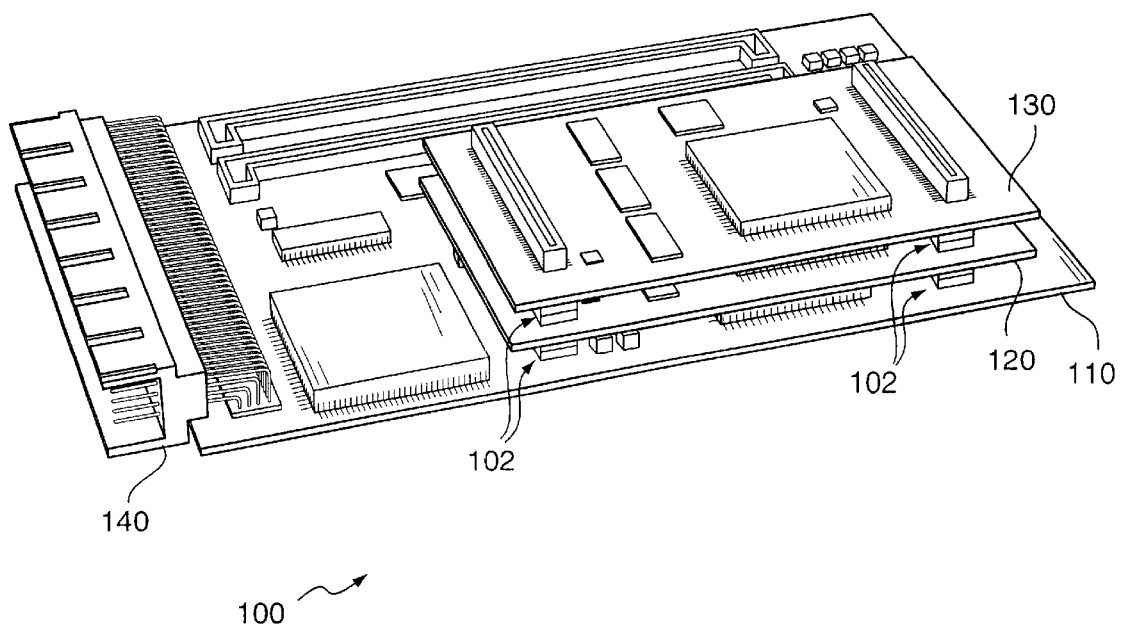
FIG. 1 is a perspective view of an embodiment of a stacked circuit assembly according to the present invention.

The present invention now will be described more fully hereinafter with reference to the accompanying drawings, in which embodiments of the invention are shown. Those skilled in the art will appreciate that the invention may be embodied in many different forms and should not be construed as limited to the embodiments set forth herein; rather, these embodiments are provided so that this disclosure will be thorough and complete, and will fully convey the scope of the invention to those skilled in the art. In the drawings, like numbers refer to like elements throughout.

It will be understood that as referred to herein, a bus may comprise a conductive, fiber optic or similar pathway for transmission of information from one location to another. For purposes of the discussion herein, busses include but are not limited to parallel and series data paths such as low-voltage differential (LVDS) or single-ended (SE) SCSI, Fibre Channel (FC) and the like. An I/O bridge circuit according to the present invention may include hardware or combinations of hardware and software that provide connectivity between such busses.

It will also be understood that as described herein, a "connector" generally comprises a group of conductors designed to releasably mate with another group of conductors. Accordingly, a connector may include, but is not limited to, groups of spring loaded finger-type contacts, groups of contacts designed to mate with such finger-type contacts, groups of pins, groups of sockets and the like. A connector may include, but is not limited to, a plurality of contacts held or mounted within a discrete frame or housing, a plurality of contacts provided on a printed circuit board or similar structure, or a group of contacts provided within a housing or frame in which other groups of contacts are also provided. For example, a "connector" may comprise a row or other grouping of pins or sockets mounted within a connector housing, or a connector may comprises a group of pins mounted to a surface of a printed circuit board and connected to circuit traces formed therein.

FIG. 1 illustrates an embodiment of a stacked circuit board assembly 100 according to the present invention. A motherboard 110 includes a connector 140, e.g., a backplane connector. Daughterboards 120, 130 are stacked on the motherboard 110 in a so-called "mezzanine" arrangement. The motherboard 110 and the daughterboards 120, 130 are interconnected by a plurality 102 of connectors. Those skilled in the art will appreciate that the motherboard 110 and the daughterboards 120, 130 may comprise boards employing using through-hole or surface-mounted devices on single or multi-layer printed circuit boards (PCBs), as well as more exotic board structures constructed using, for example, thick-film or co-fired ceramic technologies.

Figure 2:
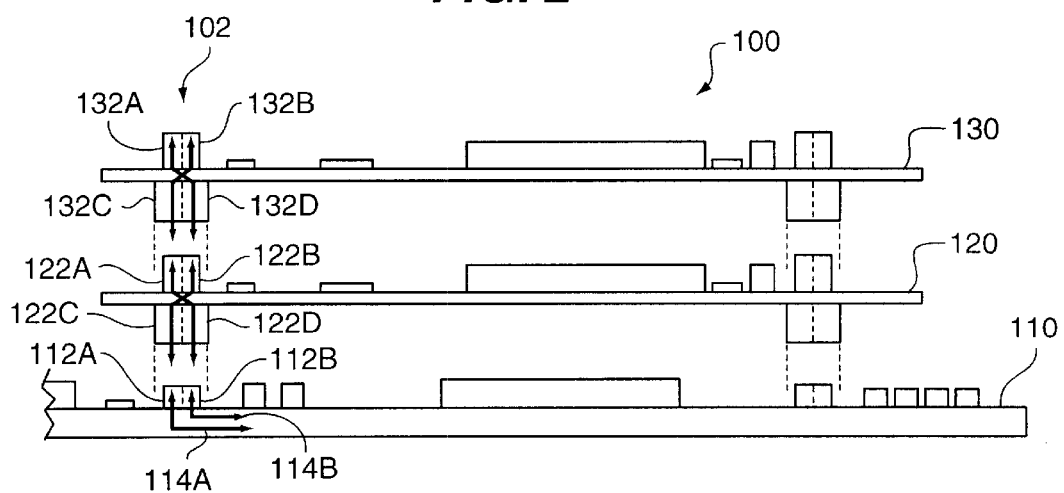
FIG. 2 is an exploded side view of the embodiment of FIG. 1.
Figure 3:
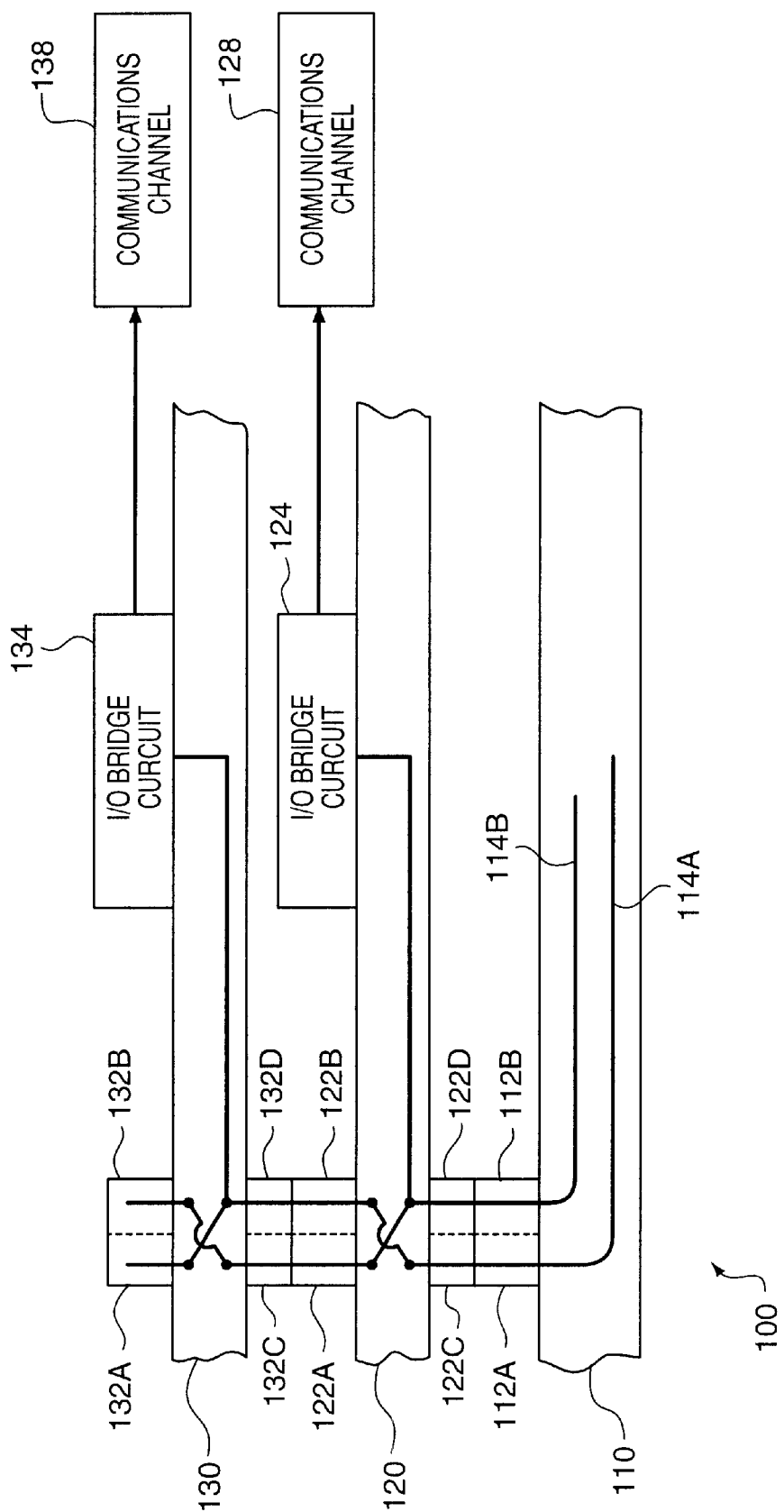
FIG. 3 is a block diagram illustrating an embodiment of an I/O bridge system according to the present invention.

The plurality 102 of connectors releasably connect the daughterboards 120, 130 to busses on the motherboard 110, as can be seen in the embodiments illustrated in FIGS. 2-3. Referring to FIG. 2, the plurality 102 of connectors includes a first connector 112A and a second connector 112B disposed on a side of the motherboard 110 here illustrated as groups of pins contained within portions of a single housing. First and second busses 114A, 114B are provided at the first and second connectors 112A, 112B, respectively.

A first daughterboard 120 comprises a first connector 122A disposed on a first side of the first daughterboard 120, and a second connector 122B positioned laterally adjacent the first connector 122A. A third connector 122C is disposed on a second side of the daughterboard 120, opposite the first connector 122A. A fourth connector 122D is positioned laterally adjacent the third connector 122C, opposite the second connector 122B. The third and fourth connectors 122C, 122D mate with the first and second connectors 112A, 112B, respectively, of the motherboard 110.

A second daughterboard 130 has a similar construction, including a first connector 132A disposed on a first side of the second daughterboard 130 and a second connector 132B positioned laterally adjacent the first connector 132A. A third connector 132C is disposed on a second side of the second daughterboard 130, opposite the first connector 132A. A fourth connector 132D is positioned laterally adjacent the third connector 132C, opposite the second connector 132B.

As illustrated in FIG. 3, the first and second daughterboards 120, 130 include respective first and second bus interface circuits, here illustrated as first and second I/0 bridge circuits 124, 134. The VO bridge circuits communicate between a communications channel 128, 138, e.g., a Fibre Channel, a SCSI bus or the like, and one of the first and second busses 114A, 114B of the motherboard 110. As conceptually illustrated in FIG. 2 and FIG. 3, the connectors of the first and second daughterboards 120, 130 are configured such that alternating connectivity is provided between the VO bridge circuits 124, 134 and the first and second busses 114A, 114B of the motherboard 110. Accordingly, a bus interface circuit of a daughterboard is connected to one of the first and second busses 114A, 114B depending upon its position in the stack of daughterboards.

Figure 4:
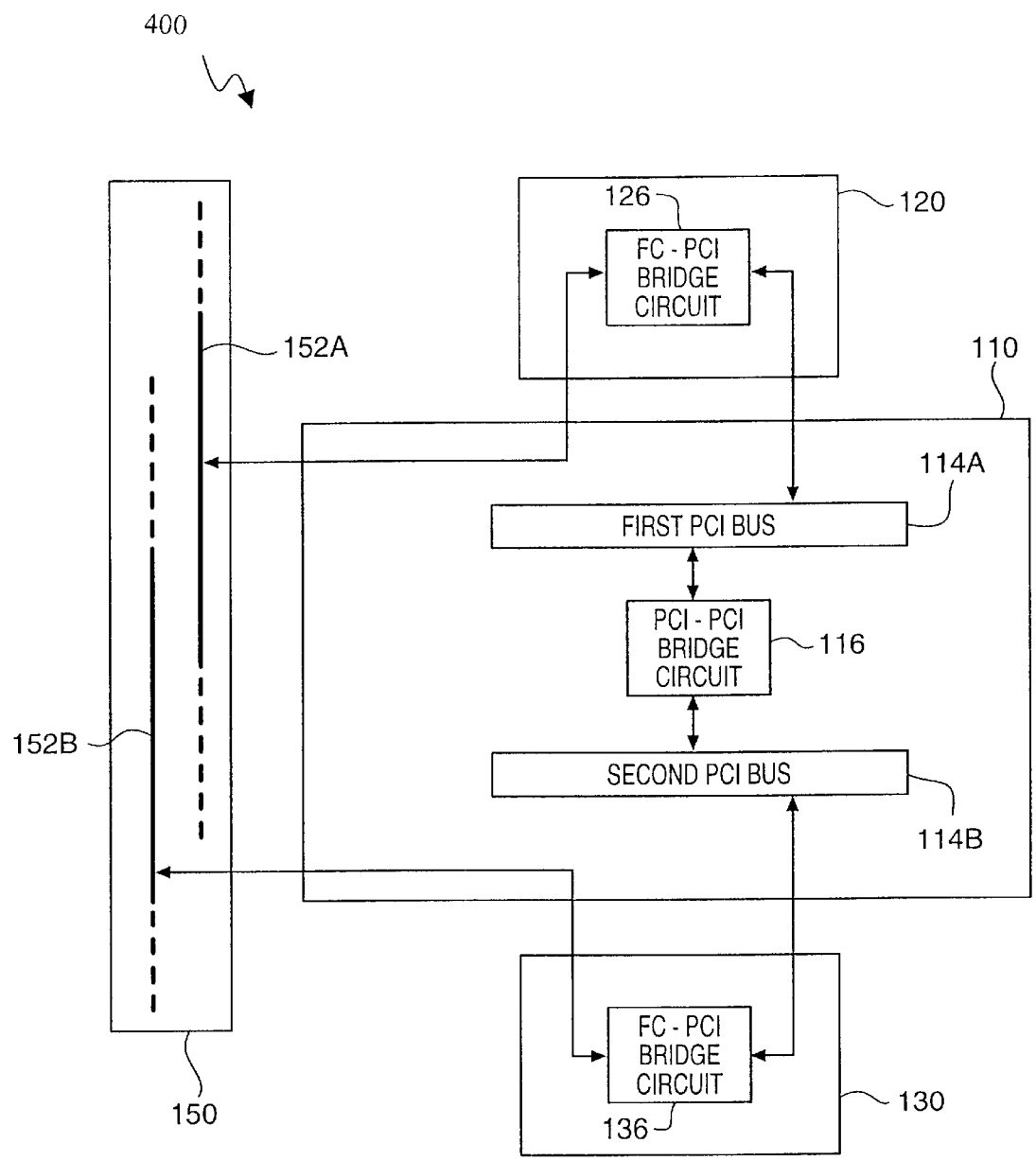
FIG. 4 is a block diagram illustrating an embodiment of a modular I/O bridge system according to the present invention.

An exemplary I/O bridge system 400 that may be implemented using the stacked circuit assembly of the present invention is illustrated in FIG. 4. A motherboard 110 includes first and second PCI busses 114A, 114B. Communications between the first and second PCI busses 114A, 114B are provided by a PCI-PCI bridge circuit 116. A first daughterboard 120 includes a FC-PCI bridge circuit 126 which is operative to communicate between the first PCI bus 114A and a first Fibre Channel 152A. A second daughterboard 130 includes a FC-PCI bridge circuit that is operative to communicate between the second PCI bus 114B and a second Fibre Channel 152B. An example of such a modular PCI bridge structure is described in a U.S. patent application entitled "Fault-Tolerant Redundant Bus Bridge Systems and Methods," by Khosrowpour, filed Apr. 17, 1998, 09/062,279, now U.S. Pat. No. 6,202,115 assigned to the assignee of the present invention and incorporated herein its entirety as if the text is physically present. If an alternating connector arrangement such as that illustrated in FIGS. 2 and 3 is applied to the system of FIG. 4, the connections between the external communications channels, e.g., the Fibre Channels 152A, 152B, and the PCI busses 114A, 114B may be easily reconfigured by simply changing the arrangement of the daughterboards 120, 130.

The Fiber Channel connections illustrated in FIG. 4 are routed through the motherboard 110, but those skilled in the art will appreciate that these connections may be provided in other ways, such as by direct connection to the daughterboards 120, 130. Those skilled in the art will also appreciate that connectivity may be provided to communications channels other than Fibre Channels, such as SCSI or other types of busses. The present invention is also applicable to stacked circuit board systems utilizing more than two daughterboards, and to systems in which more than two busses are conveyed through connectors of a stack of daughterboards to provide alternating connectivity as described above.

In the drawings and specification, there have been disclosed embodiments of the invention. Although specific terms are employed, they are used in a generic and descriptive sense only and not for purposes of limitation, the scope of the invention being set forth in the following claims. It is expected that persons skilled in the art can and will make, use or sell alternative embodiments that are within the scope of the following claims either literally or under the Doctrine of Equivalents.

That which is claimed is:

1. A fault tolerant stacked I/O bus bridge system, comprising:
    a motherboard comprising:
        a first bus; and
        a second bus; and
    an interconnected stack of daughterboards configured to couple to said first bus and said second bus of said motherboard and comprising:
        a first daughterboard configured to couple to said first bus and said second bus of said motherboard and comprising:
            a first connector that couples said first daughterboard to said first bus and said second bus of said motherboard regardless of the position of said first daughterboard in said interconnected stack of daughterboards;
            a first bus interface; and
            a first bus bridge configured to connect said first bus interface with only said first bus responsive to the order of said first daughterboard from said motherboard in said interconnected stack: and
        a second daughterboard configured to couple to said first bus and said second bus of said motherboard and comprising:
            a second connector that couples said second daughterboard to said first bus and said second bus of said motherboard regardless of the position of said second daughterboard in said interconnected stack of daughterboards;
            a second bus interface; and
            a second bus bridge configured to connect said second bus interface with only said second bus responsive to the order of said second daughterboard from said motherboard in said interconnected stack;
            whereby if said first bus bridge fails, said motherboard can be connected to said first bus interface by stacking said daughterboards in a different order.

2. The bus bridge system of claim 1 wherein the motherboard further comprises a motherboard bus bridge coupled to the first bus and the second bus and configured to interface the first bus with the second bus.

3. The bus bridge system of claim 2 wherein the first bus is a first PCI bus, the second bus is a second PCI bus, and the motherboard bus bridge is configured to interface the first PCI bus and the second PCI bus.

4. The bus bridge system of claim 1 wherein the first bus is a PCI bus, the first bus interface is configured to couple to a Fibre Channel, and the first bus bridge is configured to interface the PCI bus with the Fibre Channel.

5. The bus bridge system of claim 1 wherein the first bus is a PCI bus, the first bus interface is configured to couple to a Small Computer System Interface (SCSI) bus, and the first bus bridge is configured to interface the PCI bus with the SCSI bus.

6. The bus bridge system of claim 1 wherein the second bus is a PCI bus, the second bus interface is configured to couple to a Fibre Channel, and the second bus bridge is configured to interface the PCI bus with the Fibre Channel.

7. The bus bridge system of claim 1 wherein the second bus is a PCI bus, the second bus interface is configured to couple to a Small Computer System Interface (SCSI) bus, and the second bus bridge is configured to interface the PCI bus with the SCSI bus.

8. The bus bridge system of claim 1 wherein the motherboard further comprises a backplane connector and wherein the first bus interface is configured to couple to the backplane connector.

9. The bus bridge system of claim 8 wherein the second bus interface is configured to couple to the backplane connector.

10. The bus bridge system of claim 1 wherein the first bus interface comprises an external connector configured to connect to an external bus.

11. The bus bridge system of claim 1 wherein the second bus interface comprises an external connector configured to connect to an external bus.

12. A method of operating a fault tolerant stacked I/O bus bridge system comprising a motherboard having a first and a second bus configured to couple to an interconnected stack of daughterboards, the method comprising:
    coupling a first daughterboard to the first and the second bus of the motherboard regardless of the position of the first daughterboard in the interconnected stack of daughterboards;
    interfacing a first bus interface on the first daughterboard with only a first bus on the motherboard responsive to the order of the first daughterboard from the motherboard in the interconnected stack;
    coupling a second daughterboard to the first and the second bus of the motherboard regardless of the position of the second daughterboard in the interconnected stack of daughterboards;

interfacing a second bus interface on a second daughterboard with only a second bus on the motherboard responsive to the order of the second daughterboard from the motherboard in the interconnected stack; and changing the order of one of said daughterboards in said stack and thereby changing the bus to which said changed daughterboard is interfaced.

13. The method of claim 12 wherein the motherboard further comprises a motherboard bus bridge coupled to the first bus and the second bus and configured to interface the first bus with the second bus.

14. The method of claim 13 wherein the first bus is a first PCI bus, the second bus is a second PCI bus, and the motherboard bus bridge is configured to interface the first PCI bus and the second PCI bus.

15. The method of claim 12 wherein the first bus is a PCI bus, the first bus interface is configured to couple to a Fibre Channel, and the first bus bridge is configured to interface the PCI bus with the Fibre Channel.

16. The method of claim 12 wherein the first bus is a PCI bus, the first bus interface is configured to couple to a Small Computer System Interface (SCSI) bus, and the first bus bridge is configured to interface the PCI bus with the SCSI bus.

17. The method of claim 12 wherein the second bus is a PCI bus, the second bus interface is configured to couple to a Fibre Channel, and the second bus bridge is configured to interface the PCI bus with the Fibre Channel.

18. The method of claim 12 wherein the second bus is a PCI bus, the second bus interface is configured to couple to a Small Computer System Interface (SCSI) bus, and the second bus bridge is configured to interface the PCI bus with the SCSI bus.

19. The method of claim 12 wherein the motherboard further comprises a backplane connector and wherein the first bus interface is configured to couple to the backplane connector.

20. The method of claim 19 wherein the second bus interface is configured to couple to the backplane connector.

21. The method of claim 12 wherein the first bus interface comprises an external connector configured to connect to an external bus.

22. The method of claim 12 wherein the second bus interface comprises an external connector configured to connect to an external bus.

* * * * *